United States Patent
Miya et al.

(10) Patent No.: US 7,713,756 B2
(45) Date of Patent: May 11, 2010

(54) APPARATUS AND METHOD FOR PLASMA ETCHING

(75) Inventors: Go Miya, Ibaraki-ken (JP); Manabu Edamura, Ibaraki-ken (JP); Ken Yoshioka, Hikari (JP); Ryoji Nishio, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 559 days.

(21) Appl. No.: 11/735,657

(22) Filed: Apr. 16, 2007

(65) Prior Publication Data

US 2007/0184563 A1 Aug. 9, 2007

Related U.S. Application Data

(62) Division of application No. 10/793,886, filed on Mar. 8, 2004, now abandoned.

(30) Foreign Application Priority Data

Aug. 5, 2003 (JP) .............................. 2003-206042

(51) Int. Cl.
*H01L 21/00* (2006.01)
*H01L 21/302* (2006.01)
*H01L 21/306* (2006.01)
(52) U.S. Cl. ........................ 438/5; 438/689; 156/345.33
(58) Field of Classification Search ................. None
See application file for complete search history.

(56) References Cited

U.S. PATENT DOCUMENTS

| 5,916,369 A | 6/1999 | Anderson et al. |
| 6,418,954 B1 | 7/2002 | Taylor et al. |
| 2004/0050326 A1 | 3/2004 | Thilderkvist et al. |

FOREIGN PATENT DOCUMENTS

| JP | 62-290885 | 12/1987 |
| JP | 03-224224 | 10/1991 |
| JP | 05136098 | 6/1993 |
| JP | 5-190506 | 7/1993 |
| JP | 2002-064084 | 2/2002 |

*Primary Examiner*—Allan Olsen
(74) *Attorney, Agent, or Firm*—Antonelli, Terry, Stout & Kraus, LLP.

(57) ABSTRACT

A plasma etching method for a plasma etching apparatus including: a processing chamber for performing plasma etching on an object to be processed; a first gas supply source; a second gas supply source; a first gas inlet for introducing a processing gas into the processing chamber; a second gas inlet for introducing a processing gas into the processing chamber; a flow rate regulator for regulating the flow rate of the processing gas; and a gas shunt for dividing the first processing gas into a plurality of portions, wherein the second processing gas is merged with at least one part between the gas shunt and the first gas inlet and between the gas shunt and the second gas inlet.

2 Claims, 14 Drawing Sheets

FIG.4(a)

SET FLOW RATE OF EACH FLOW RATE REGULATOR

| GAS TYPE | FLOW RATE REGULATOR | SET FLOW RATE IN PRIOR ART (sccm) | SET FLOW RATE IN FIRST EMBODIMENT (sccm) |
|---|---|---|---|
| HYDROGEN BROMIDE (HBr) | FLOW RATE REGULATOR 42-1 | 100 | 100 |
| CHLORINE (Cl2) | FLOW RATE REGULATOR 42-2 | 50 | 50 |
| OXYGEN (O2) | FLOW RATE REGULATOR 53-1 | 5 | 4 |
| | FLOW RATE REGULATOR 53-2 | 0 | 2 |

FIG.4(b)

FLOW RATE OF PROCESSING GAS FROM EACH PROCESSING GAS INLET

| | PRIOR ART | | FIRST EMBODIMENT | |
|---|---|---|---|---|
| | FIRST INLET 65-1 | SECOND INLET 65-2 | FIRST INLET 65-1 | SECOND INLET 65-2 |
| FLOW RATE RATIO OF GAS SHUNT 60 | 100% | 0% | 80% | 20% |
| FLOW RATE OF HBr (sccm) | 100 | 0 | 80 | 20 |
| FLOW RATE OF Cl2 (sccm) | 50 | 0 | 40 | 10 |
| FLOW RATE OF O2 (sccm) | 5 | 0 | 4 | 2 |
| TOTAL FLOW RATE (sccm) | 155 | 0 | 124 | 32 |

VALUE OF GATE WIDTH 8 OF OBJECT TO BE PROCESSED 1
(COMPARISON BETWEEN PRIOR ART AND FIRST EMBODIMENT)

|  | CENTER (RADIUS POSITION 0 mm) | OUTER REGION (RADIUS POSITION 140 mm) |
|---|---|---|
| PRIOR ART | 127nm | 120nm |
| FIRST EMBODIMENT | 131nm | 127nm |

PHOTORESIST MASK WIDTH 7-1 > PHOTORESIST MASK WIDTH 7-2

CENTER OF OBJECT                OUTER REGION OF OBJECT

BEFORE ETCHING

GATE WIDTH 8-1 ≒ GATE WIDTH 8-2

CENTER OF OBJECT                OUTER REGION OF OBJECT

AFTER ETCHING

BEFORE ETCHING

AFTER ETCHING

APPARATUS AND METHOD FOR PLASMA ETCHING

CROSS REFERENCE TO RELATED APPLICATION

This is a divisional of U.S. application Ser. No. 10/793,886, filed Mar. 8, 2004 now abandoned. This application relates to and claims priority from Japanese Patent Application No. 2003-206042, filed on Aug. 5, 2003. The entirety of the contents and subject matter of all of the above is incorporated herein by reference.

BACKGROUND OF THE INVENTION

1. Field of the Invention

The present invention relates to a plasma etching apparatus for processing an object to be processed such as a semiconductor wafer, and a plasma etching method using the plasma etching apparatus.

2. Description of the Related Art

In a semiconductor chip manufacturing process, a plasma etching apparatus using reactive plasma to process an object to be processed such as a semiconductor wafer is conventionally used.

Here, with reference to a cross-sectional view of an object to be processed shown in FIG. 13, etching for forming a poly-silicon (Poly-Si) gate electrode of an MOS (Metal Oxide Semiconductor) transistor (hereinafter referred to as "gate etching") will be explained as one example of a plasma etching process. As shown in FIG. 13(a), an object to be processed 1 prior to etching is formed of a silicon dioxide ($SiO_2$) film 3, poly-silicon film 4 and photoresist mask 5 deposited on the surface of a silicon (Si) substrate 2 in the named order. This photoresist mask 5 is formed via a photolithography process by applying a photoresist, projecting the same pattern onto one or a plurality of chips for exposure to light using a mask called a "reticule" through a reduced projection photolithography apparatus, and developing the same. The dimension of this photoresist mask 5, that is, a photoresist mask width 7, greatly affects the width of a gate electrode which will be described later, and is therefore subject to strict control.

Gate etching is a process for removing the poly-silicon film 4 in an area not covered with the photoresist mask 5 by exposing the object to be processed 1 to reactive plasma, and by this process, a gate electrode 6 is formed as shown in FIG. 13(b). Since a gate width 8 at the bottom of the gate electrode 6 greatly affects the performance of the electronic device, it is subject to strict control as most important CD (critical dimension). For this reason, a target completion dimension is preset for the gate width 8.

Furthermore, a value obtained by subtracting the gate width 8 after etching from the photoresist mask width 7 before etching is called a "CD shift", and constitutes an important index for expressing the quality of gate etching.

A conventional example of a plasma etching apparatus which carries out the above described gate etching will be explained with reference to FIG. 14. A processing chamber cover 12 is placed on a quasi-cylindrical processing chamber side wall 11, and a processing chamber 13 defined by the above parts is provided with a substrate holder 14.

A processing gas 21 is introduced into the processing chamber 13 through an inlet 22 provided in the central part of the processing chamber cover 12 to generate plasma 25. Plasma etching is performed by exposing the object to be processed 1 to this plasma 25. The processing gas 21 and a volatile substance generated by the reaction in the plasma etching processing are exhausted from the outlet 30. A vacuum pump (not shown here) is connected to the tip of the outlet 30 and the pressure in the processing chamber 13 is thereby reduced to approximately 1 Pa (Pascal).

Gate etching is performed using the plasma etching apparatus as described above, but with the recent increase in the diameter of the object to be processed 1, it is becoming more difficult to secure the in-plane uniformity of etching rates or the in-plane uniformity of the gate width 8 over a wide area of the object to be processed 1. Likewise, along with the recent miniaturization of semiconductor devices, demands are increasing for more severe dimensional control of the gate width 8.

Next, adhesion and deposition of reaction products onto the side of a gate electrode, which is one of influences on the dimension of the gate width 8, will be explained. A plurality of gases such as chlorine ($Cl_2$), hydrogen bromide (HBr) and oxygen ($O_2$) are conventionally used for processing of gate etching. During etching, these gases are in a plasma state to perform etching on the poly-silicon film 4, but during the process, chlorine, hydrogen bromide and oxygen contained in the processing gas 21 are dissociated, and the thus-produced ions and radicals of Cl (chlorine), H (hydrogen), Br (bromine) and O (oxygen) react with silicon deriving from the poly-silicon film 4, producing reaction products. Of these reaction products, volatile ones are exhausted from the outlet 30, but non-volatile products are adhered or deposited onto the inner side (vacuum side) of the processing chamber side wall 11, the processing chamber cover 12 and the sides of the poly-silicon film 4 and photoresist mask 5. When the reaction products are deposited on the sides of the poly-silicon film 4 and photoresist mask 5, they serve as a mask for etching, which often increases the gate width 8.

Especially when a compound $SiBr_x$ (x=1, 2, 3) of silicon and bromine or compound $SiCl_x$ (x=1, 2, 3) of silicon and chlorine reacts with oxygen (O), $Si_xBr_yO_z$ (x, y, z: natural number) or $Si_xCl_yO_z$ (x, y, z: natural number) which are non-volatile and have high deposition characteristic is produced, and adhesion or deposition of these products to the poly-silicon film 4 and photoresist film 5 may cause an increase of the gate width 8.

The increase of the gate width 8 may occur nonuniformly within the plane of the object to be processed 1. That is, nonuniform CD shifts may occur within the plane of the object to be processed 1. For example, in an area with a high etching rate, the concentration of reaction products including silicon deriving from the poly-silicon film 4 becomes higher than in areas with a low etching rate, which may cause in-plane nonuniformity of CD shifts.

Furthermore, in the central part of the object to be processed 1, all surrounding areas are subject to etching, whereas outside the outermost region of the wafer, there is no area subject to etching. For this reason, even if an etching rate is uniform within the plane of the object to be processed 1, the concentration of reaction products including silicon deriving from the poly-silicon film 4 is high in the center portion and low in the outer regions. This may also cause in-plane non-uniformity of CD shifts.

Furthermore, as described above, reaction products are deposited on the processing chamber side wall 11 or inner side (vacuum side) of the processing chamber cover 12 through plasma etching processing, but during plasma etching, radicals and ions of chlorine, hydrogen, bromine, oxygen and these compounds may be dissociated from these depositions and discharged into the plasma 25. In this case, the concentration of the radicals and ions discharged from the reaction products is likely to increase in the outer regions of the object to be processed 1. This is because the processing chamber cover 12 is placed parallel to the object to be processed 1 as shown in FIG. 14, and radicals and ions discharged from the deposited reaction products are likely to disperse over the whole object to be processed 1, while the processing chamber side wall 11 is located to surround the outer regions of the object to be processed 1 and radicals and ions discharged from the reaction products deposited thereto are likely to cause an increase of concentration in the outer regions of the object to be processed 1. The radicals and ions discharged from the reaction products as described above may cause deterioration of in-plane uniformity of CD shifts on the surface of the object to be processed 1.

As described above, nonuniformity of concentration of reaction products is caused on locations within the plane of the object to be processed 1, but this nonuniformity varies from moment to moment according to the condition in the processing chamber 13. That is, even if the total amount and composition of the processing gas 21 or process input conditions such as the pressure in the processing chamber 13 are the same when plasma etching is performed, CD shifts fluctuate. This is because the adhesion condition of reaction products deposited on the processing chamber cover 12 and processing chamber side wall 11 varies from moment to moment as the plasma etching processing advances as described above.

In addition to the advance of the above described plasma etching processing, the condition in the processing chamber also changes through a process called "cleaning." Every time the aforementioned plasma etching process is carried out, the amount of reaction products deposited on the inner side (vacuum side) of the processing chamber side wall 11 and the processing chamber cover 12 increases. When these depositions fall off and attach to the surface of the object to be processed 1, the yield of volume production of semiconductor devices is deteriorated. To prevent this, plasma cleaning using reactive plasma is carried out periodically to remove the aforementioned depositions. Furthermore, depositions which cannot be removed by plasma cleaning are removed by operations called "wet cleaning" or "manual cleaning" which are manually performed by the operator with the processing chamber 13 left open to the atmosphere. These two types of cleaning processes reduce the amount of depositions stuck to the processing chamber cover 12 and processing chamber side wall 11. As shown above, since the condition in the processing chamber 13 varies from moment to moment, distributions of radicals and ions on the surface of the object to be processed 1 also change accordingly.

In the plasma etching apparatus of the conventional example (prior art) shown in FIG. 14, the processing gas is only introduced from the inlet 22 provided above the central part of the object to be processed 1, and therefore the concentration of radicals of gas components contained in the processing gas or ions resulting from dissociation is often high in the central part and low in the outer regions of the object to be processed 1.

One art intended to improve in-plane uniformity of ions and radicals in plasma is an art of introducing a processing gas from a plurality of parts of the processing chamber. This art relates to a reactive ions etching apparatus provided with a flow rate controller capable of introducing the processing gas into the processing chamber through a plurality of inlets and controlling the flow rate of the processing gas for each inlet independently (e.g., see Patent Document 1). This art is capable of changing the in-plane uniformity of the etching rate, but since the processing gas introduced from the respective inlets has the same composition, it cannot sufficiently adjust the in-plane uniformity of ions and radicals.

There is another art of introducing a reaction product gas into the processing chamber for the purpose of improving the concentration distribution of reaction products on the surface of the object to be processed 1. This art relates to a method of dry etching which provides two gas inlets, introduces a reactive gas from one inlet and introduces a reaction product gas generated by an etching reaction from the other inlet as a reaction inhibition gas for the purpose of equalizing the etching rate on an object to be processed (e.g., see Patent Document 2). The use of this method can adjust the in-plane uniformity of ions and radicals and improve in-plane uniformity of the etching rate.

However, since the position of introducing the reaction product gas as the reaction inhibition gas is limited to one inlet, this structure has constraints on the improvement of in-plane uniformity of the etching rate. For example, when the etching rate in the central part of the object to be processed is greater than the etching rate in the outer regions, it is possible to improve the in-plane uniformity of the etching rate by introducing a reaction product gas into the central part as the reaction inhibition gas. However, on the contrary, when the etching rate in the outer regions of the object to be processed is greater than the etching rate in the central part, this structure requires gas pipes to be replaced, so it is unable to respond to the demand quickly. It also has the disadvantage that a supply source of the reaction product gas and piping system need to be added in addition to the gas used for normal etching to the apparatus.

In view of the above described problems, it is an object of the present invention to provide a plasma etching apparatus and plasma etching method capable of carrying out processing with excellent in-plane uniformity on an object to be processed having a large diameter.

[Patent Document 1]
Japanese Patent Application Laid-Open No. 62-290885

[Patent Document 2]
Japanese Patent Application Laid-Open No. 5-190506

[Patent Document 3]
Specification of U.S. Pat. No. 6,418,954

BRIEF SUMMARY OF THE INVENTION

In order to solve the problems of the above described prior arts, the present invention provides a plurality of inlets 65 for introducing a processing gas 21 into a processing chamber 13 and uses the respective inlets 22 to adjust the flow rate or composition of the processing gas 21. The processing gas (first processing gas) from a common gas system at that time is divided into a plurality of portions, a gas from an additional gas system (second processing gas) is mixed with the respective piping systems after the division to thereby adjust the composition and/or flow rate of the processing gas introduced from the plurality of inlets provided in the processing chamber 13.

Furthermore, the present invention measures the size of a photoresist mask width 7 formed in a photolithography process before plasma etching and makes an analysis using the measurement result to thereby adjust the composition and/or flow rate of the processing gas 21 introduced through the plurality of inlets.

Furthermore, the present invention measures the gate width 8 after etching and makes an analysis using the measurement result to thereby adjust the composition and/or flow rate of the processing gas 21 introduced through the plurality of inlets.

Furthermore, the present invention calculates the amount of deposition in the processing chamber 13 from the photo-reception result of plasma emission, estimates the amount of generated ions and radicals from the calculation result to thereby adjust the composition and/or flow rate of the processing gas 21 introduced from the plurality of inlets.

Furthermore, the present invention provides a plurality of plasma emission photoreception sections above the object to be processed 1, calculates distributions of ions and radicals from the plasma photoreception result and adjusts the composition and/or flow rate of the processing gas 21 introduced from the plurality of inlets using the result.

BRIEF DESCRIPTION OF THE DRAWINGS

FIG. 4 is a table showing a set flow rate of the processing gas used in the first embodiment of the present invention and flow rate of each gas;

DETAILED DESCRIPTION OF THE PREFERRED EMBODIMENTS

First Embodiment

Figure 1:
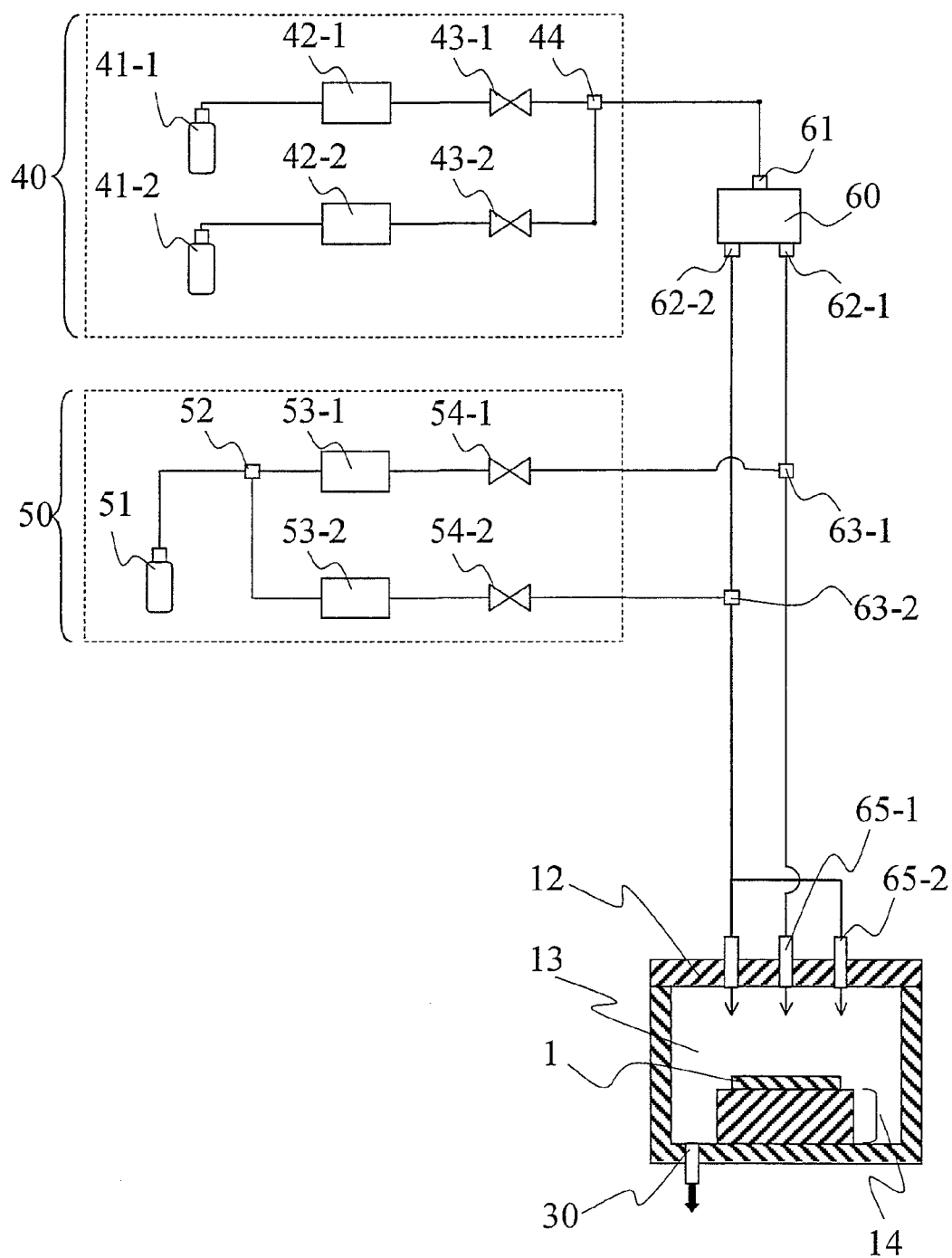
FIG. 1 illustrates a gas piping system of a first embodiment of the present invention.

With reference to FIG. 1 through FIG. 6, a first embodiment of the present invention will be described in detail below. FIG. 1 illustrates a gas piping system of a plasma etching apparatus to which the first embodiment of the present invention is applied.

Figure 2:
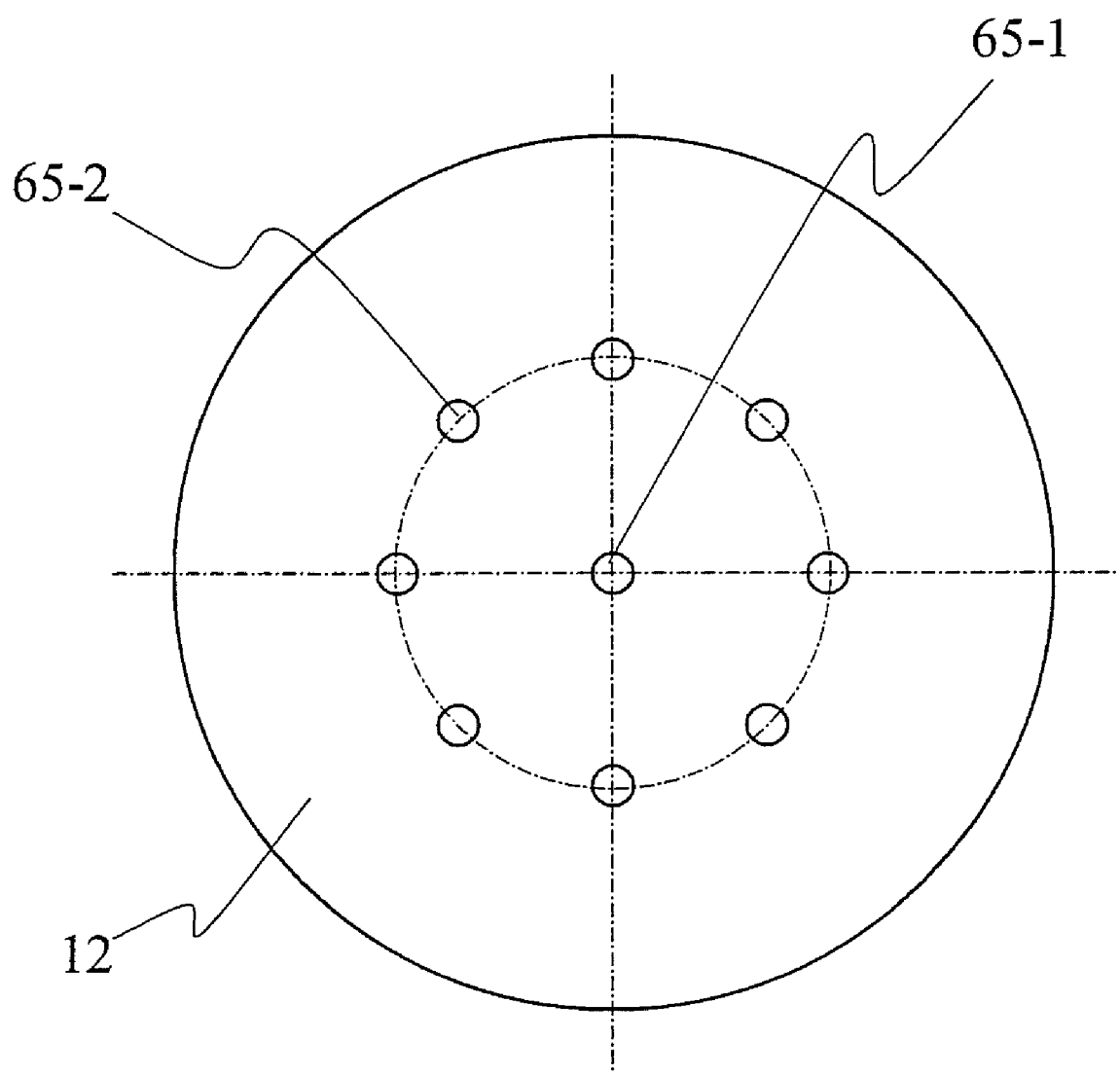
FIG. 2 is a top view of a processing chamber cover used in the first embodiment of the present invention.

Furthermore, a top view of a processing chamber cover 12 in this embodiment is shown in FIG. 2. As shown in FIG. 2, a first gas inlet 65-1 is set in the center portion of the processing chamber cover 12 and eight second gas inlets 65-2 are set in a circular form around the first gas inlet 65-1.

As shown in FIG. 1, this plasma etching apparatus is constructed of a processing chamber 13 having a processing chamber cover 12, a substrate holder 14 provided in the processing chamber, a first gas inlet 65-1 and second gas inlets 65-2 provided in the processing chamber cover 12, a common gas system 40 which is a first processing gas supply source, an additional gas system 50 which is a second processing gas supply source, a shunt 60 which shunts a first processing gas from the common gas system 40 into a plurality of parts, a merging section 63-1 provided at a position of a pipe between a first shunt outlet 62-1 of the shunt 60 and the first gas inlet 65-1 for merging a second processing gas and a merging section 63-2 provided at a position of a pipe between a second shunt outlet 62-2 of the shunt 60 and the second gas inlet 65-2 for merging the second processing gas.

The common gas system 40 is constructed of gas cylinders 41-1 and 41-2 as gas supply sources, flow rate regulators 42-1 and 42-2 which regulate the flow rates of the respective gases, valves 43-1 and 43-2 which let pass or stop the respective gases and a merging section 44 which merges the respective gases of the common gas system 40.

In this embodiment, the gas cylinder 41-1 is filled with hydrogen bromide (HBr) and the gas cylinder 41-2 is filled with chlorine ($Cl_2$) as common gases.

The common gases which have merged at the merging section 44 are guided to the gas shunt 60 located downstream. The gas shunt 60 is a device having the function of shunting an arbitrary gas which has entered a gas shunt inlet 61 into a plurality of shunt outlets at an arbitrary flow rate ratio. This gas shunt 60 shunts a processing gas into two shunt outlets, and one shunt outlet thereof is provided with a flow meter which measures the flow rate of the processing gas and a restrictor which restricts or regulates the flow of the processing gas, and the other shunt outlet is provided with a mass flow controller which can let flow the processing gas at a set flow rate. A flow rate set value is sent from this flow meter to a mass flow controller, which makes it possible to shunt the processing gas entering the inlet into two shunt outlets at an arbitrary flow rate ratio (e.g., see Patent Document 3).

In this embodiment, a mixed gas of hydrogen bromide and chlorine is shunt into two outlets by this gas shunt 60; shunt outlet 62-1 and shunt outlet 62-2, at a flow rate ratio of 8:2.

The additional gas system 50 is constructed of a gas cylinder 51 as a gas supply source, a branch 52 for branching the gas into plural portions (2 portions in this embodiment), flow rate regulators 53-1 and 53-2 which regulate the flow rates of the respective gases, and valves 54-1 and 54-2 for letting flow or stopping the gas. In this embodiment, oxygen ($O_2$) is put in a gas cylinder 51 as an additional gas.

The common gas (a mixed gas of hydrogen bromide and chlorine in this embodiment) output from the shunt outlet 62-1 merges with the additional gas (oxygen in this embodiment) which has passed through the valve 54-1 at the merging section 63-1, and the mixed gas of common gas and additional gas is guided to the first gas inlet 65-1 provided in the center of the processing chamber cover 12.

Likewise, the common gas (a mixed gas of hydrogen bromide and chlorine in this embodiment) output from the shunt outlet 62-2 merges with the additional gas (oxygen in this embodiment) which has passed through the valve 54-2 at the merging section 63-2, and the mixed gas of common gas and additional gas is guided to the second gas inlets 65-2 provided in the outer regions of the processing chamber cover 12.

Using the above described structure and by regulating the set flow rates of the flow rate regulators 42-1, 42-2, 53-1 and 53-2 and the flow rate ratio between the shunt outlet 62-1 and shunt outlet 62-2 of the shunt 60, processing gases having different flow rates and compositions are introduced through the first gas inlet 65-1 and second gas inlets 65-2.

Then, the plasma etching apparatus of this embodiment will be explained with reference to FIG. 3. The processing chamber cover 12 is placed on the processing chamber side wall 11 and in the processing chamber 13 formed of these parts, the substrate holder 14 is placed. A circular groove is formed in the top end face of the processing chamber side wall 11 and an O-ring 15 is filled in this groove. This O-ring 15 keeps the processing chamber 13 airtight.

A chucking electrode 16 is buried in the substrate holder 14, and an electrostatic force is produced between the chucking electrode 16 and object to be processed 1 by a DC power supply 17 connected to the chucking electrode 16, whereby the object to be processed 1 is attracted to the substrate holder 14. Furthermore, a switch 18 is provided between the chucking electrode 16 and DC power supply 17 for turning ON/OFF a DC voltage to be applied.

The processing gas 21-1 which has passed through the merging section 63-1 and the processing gas 21-2 which has passed through the merging section 63-2 are introduced into the processing chamber 13 through the first inlet 65-1 and the second inlets 65-2, respectively. These first inlet 65-1 and second inlets 65-2 are formed of pipes penetrating the processing chamber cover 12. High-frequency coils 23 are placed on the processing chamber cover 12 and when a high-frequency power supply 24 applies high frequency to the high-frequency coils 23, the processing gas 21 is transformed into plasma 25. A switch 26 is provided between the high-frequency coils 23 and high-frequency power supply 24 for turning ON/OFF a high-frequency voltage to be applied.

Plasma etching process is performed by exposing the object to be processed 1 to the plasma 25. A high-frequency application electrode 27 for applying a high-frequency voltage is buried in the substrate holder 14, and when the high-frequency voltage is applied by a high-frequency power supply 28 connected thereto, the high-frequency application electrode 27 produces a bias potential, attracts ions produced in the plasma 25 into the object to be processed 1 and performs anisotropic etching. A switch 29 is provided between the high-frequency application electrode 27 and the high-frequency power supply 28 for turning ON/OFF the high-frequency voltage to be applied.

The processing gas 21 and volatile substances produced by a reaction in the plasma etching processing are exhausted through an outlet 30. A vacuum pump (not shown here) is connected to the tip of the outlet 30 to reduce the pressure in the processing chamber 13 to approximately 1 Pa (Pascal). Furthermore, a pressure regulating valve 31 is provided between the outlet 30 and the vacuum pump to regulate the pressure in the processing chamber 13 by regulating the opening of the pressure regulating valve 31.

Here, set flow rates of the respective processing gases and the numbers of flow rate regulators which regulate the respective flow rates used in the conventional example and this embodiment are shown in FIG. 4(a), and the flow rate ratio of the gas shunt 60 and the flow rates of the processing gases introduced through first inlet 65-1 and second inlets 65-2 are shown in FIG. 4(b). In FIG. 4(b), when the shunt ratio of the gas shunt 60, that is, the ratio of the flow rate from the shunt outlet 62-1 to the flow rate from the shunt outlets 62-2 is 100:0 and the set flow rate of the flow rate regulator 53-2 is 0 sccm, the processing gas is introduced only through the gas inlet 65-1 placed in the center of the processing chamber cover 12, which is equivalent to the processing in the conventional example, and therefore described as the conventional example.

In the case of the condition shown in FIG. 4, while the flow rate ratio of hydrogen bromide, chlorine and oxygen of the processing gas introduced through the first inlet 65-1 in the conventional example and this embodiment is 20:10:1, the flow rate ratio of hydrogen bromide, chlorine and oxygen of the processing gas introduced through the second inlets 65-2 of this embodiment is 20:10:2. That is, in this embodiment, the processing gas of higher oxygen concentration is introduced through the second inlets 65-2 than through the first inlet 65-1.

Figures 5A, 5B:
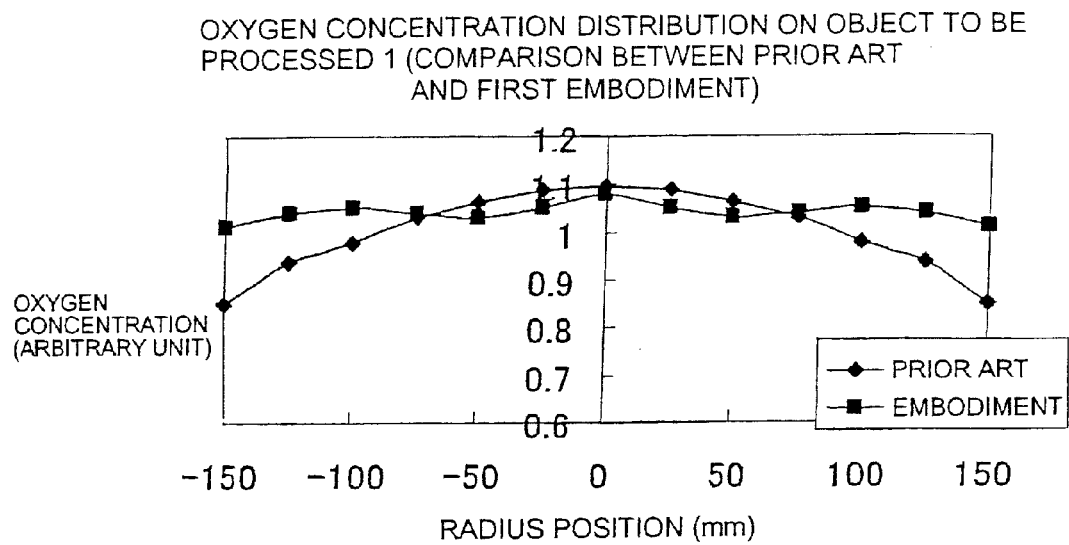
FIG. 5 is a graph showing an oxygen concentration distribution and a table showing a gate width, which shows a comparison between results obtained from the first embodiment of the present invention and results obtained from the conventional example.

Next, FIG. 5(a) shows a comparison of the oxygen concentration distribution on the surface of the object to be processed 1 having a diameter of 300 mm between the conventional example and the present embodiment. As opposed to the conventional example where the oxygen concentration is lower in the outer regions than in the center portion of the object to be processed, it is evident in this embodiment that the reduction of oxygen concentration in the outer regions is suppressed and that the in-plane uniformity is improved. Furthermore, FIG. 5(b) shows the measurement result of the gate width 8 of the object to be processed 1. As shown in this figure, while there is a large difference of the gate width 8 between the center portion and outer region of the prior art, the difference is reduced in this embodiment. This is because the processing gas of higher oxygen concentration is introduced into the outer regions than the center portion, non-volatile reaction products $Si_xBr_yO_z$ (x, y, z: natural number) or $Si_xCl_yO_z$ (x, y, z: natural number) are deposited more on the sides of the poly-silicon film 4 and photoresist film 5 in the outer regions than the center portion and the gate width 8 is increased compared to the conventional example. Thus, by introducing processing gases having different mixing ratios through a plurality of gas inlets 65, it is possible to improve the in-plane uniformity of CD shifts of the object to be processed 1 and realize gate etching whereby the gate width 8 becomes more uniform within the plane.

According further to this embodiment, when the processing gases are introduced into a plurality of gas inlets 65 as shown in FIG. 1, a common gas which is commonly introduced to the plurality of gas inlets 65 (hydrogen bromide and chlorine in this embodiment) is shunted by the gas shunt 60 at an arbitrary flow rate ratio and the additional gases (oxygen in this embodiment) with different flow rates are introduced at places downstream from the respective shunt outlets 62-1 and 62-2. This makes it possible to introduce processing gases having different flow rates and compositions from the plurality of gas inlets 65 with a simple structure.

This embodiment uses hydrogen bromide and chlorine as common gases, but common gases are not limited to them and other gases can also be used.

Furthermore, this embodiment uses oxygen as an additional gas. However, the additional gas is not limited to oxygen, and it is possible to use other gases for generating depositional reaction products as additional gases. Furthermore, on the contrary, it is also possible to use gases which inhibit the generation of depositional reaction products as additional gases, regulate their concentration distributions within the plane of the object to be processed 1 to thereby improve the in-plane uniformity of the gate width 8.

Furthermore, this embodiment uses two types of gases of hydrogen bromide and chlorine as common gases, but common gases are not limited to these. It is also possible to use a single gas, or three or more types of gases as the common gas.

Figure 6:
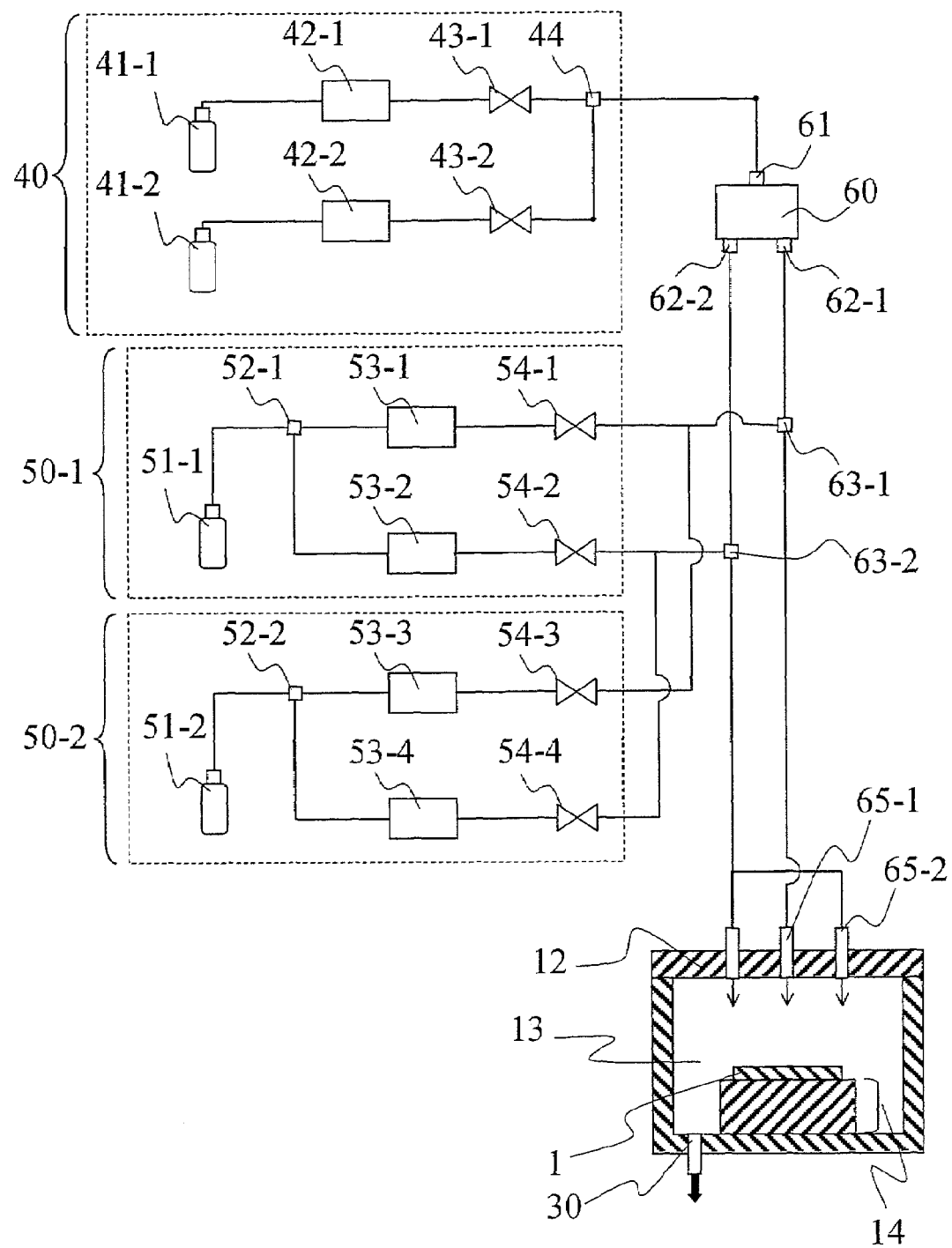
FIG. 6 illustrates the gas system of the first embodiment of the present invention, which shows a structure different from that in FIG. 1.

Furthermore, this embodiment only uses oxygen as an additional gas, but the additional gas is not limited to one type of gas, and a plurality of gases can also be used. FIG. 6 shows an example of using a plurality of additional gases. In this case, it is possible to provide a first additional gas system 50-1 consisting of a gas cylinder 51-1 filled with a first additional gas, a branch 52-1, flow rate regulators 53-1 and 53-2 and valves 54-1 and 54-2, and a second additional gas system 50-2 consisting of a gas cylinder 51-2 filled with a second additional gas, a branch 52-2, flow rate regulators 53-3 and 53-4 and valves 54-3 and 54-4. The common gases output from the gas shunt outlets 62-1 and 62-2 are mixed with the first additional gas and second additional gas at the sections 63-1 and 63-2, respectively, and the processing gases with different flow rates and compositions are introduced into the gas inlets 65-1 and 65-2.

Furthermore, this embodiment uses a smaller total flow rate of the processing gas 21-2 introduced from the gas inlets 65-2 placed in the outer regions of the processing chamber cover 12 than a total flow rate of the processing gas 21-1 introduced from the gas inlet 65-1 placed in the center portion, but the present invention is not limited to this embodiment. The implementer of the present invention can freely decide the flow rates of the processing gases introduced from the respective inlets to realize optimal plasma etching. Therefore, if a greater total flow rate of the processing gas 21-2 should be introduced from the gas inlets 65-2 than a total flow rate of the processing gas 21-1 introduced from the gas inlet 65-1 to achieve a better etching result, such setting is also acceptable.

Furthermore, this embodiment assigns a greater value to the ratio of the oxygen flow rate to the total flow rate of the processing gas 21-2 introduced through the gas inlets 65-2 than the ratio of the oxygen flow rate to the total flow rate of the processing gas 21-1 introduced through the gas inlet 65-1, but the present invention is not limited to this embodiment. For example, when the gate width 8 in the outer regions is greater than a target completion size and the gate width 8 in the center portion is smaller than the target product size, it is possible to reduce the ratio of the oxygen flow rate to the total flow rate of the processing gas 21-2 introduced through the gas inlets 65-2 and increase the oxygen flow rate to the total flow rate of the processing gas 21-1 introduced through the gas inlet 65-1 to thereby approximate the gate widths 8 at the respective positions to the target completion size.

Furthermore, this embodiment uses the gas shunt 60 described in Patent Document 3, but the present invention is not limited to this embodiment. It is possible to use a device having a different structure to shunt the processing gas into a plurality of parts. Furthermore, this embodiment provides the merging section 63-1 for merging the second processing gas on the pipe between the first shunt outlet 62-1 of the shunt 60 which shunts the first processing gas from the common gas system 40 into a plurality of portions and the first gas inlet 65-1, and the merging section 63-2 for merging the second processing gas on the pipe between the second shunt outlet 62-2 of the shunt 60 and the second gas inlet 65-2, but it is also possible to adopt a structure having at least one of the merging sections 63-1 and 63-2 for merging the second processing gas.

Second Embodiment

Figure 7:
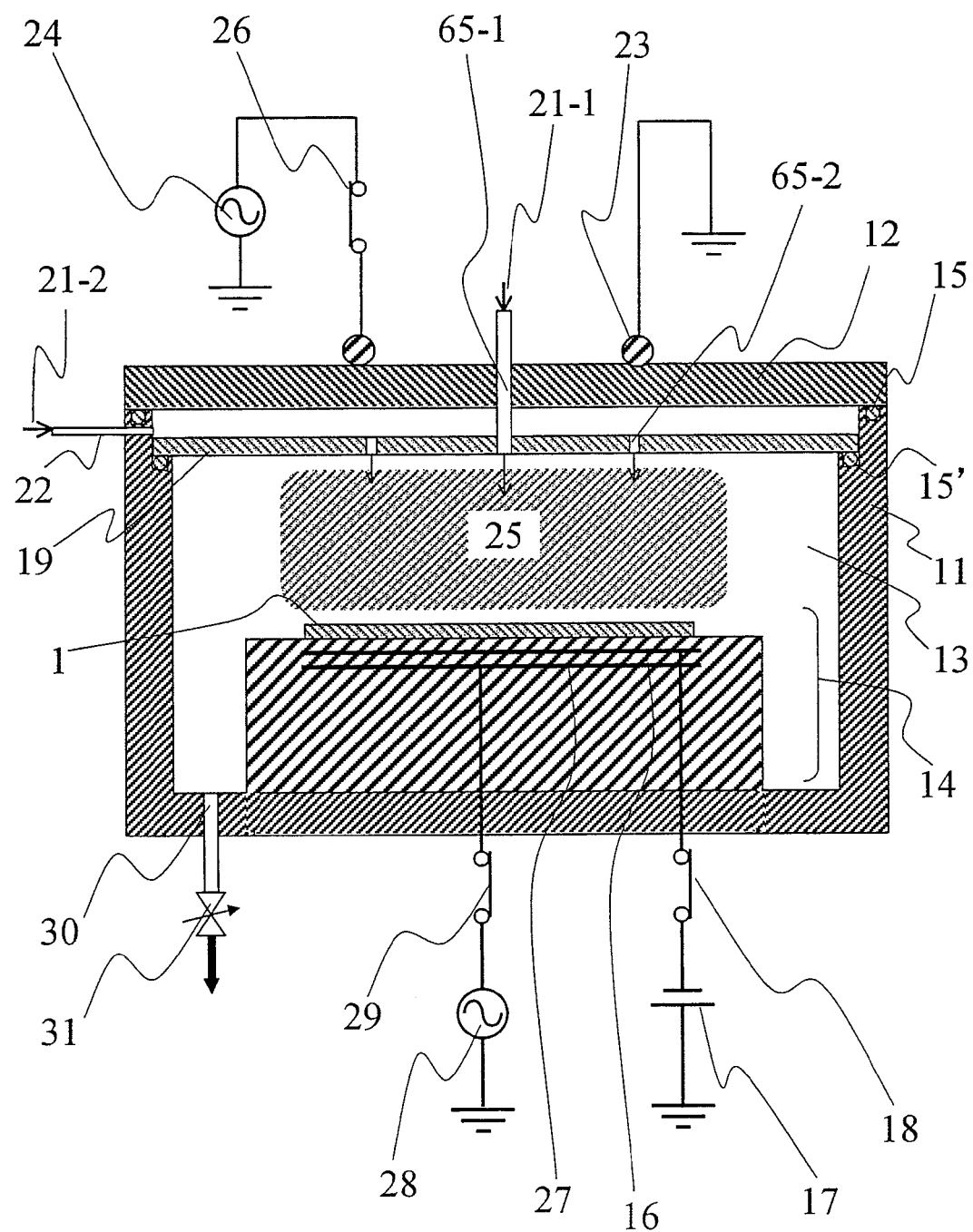
FIG. 7 is a sectional side view of a processing chamber used in a second embodiment of the present invention.

Then, a second embodiment of the present invention will be explained using FIG. 7 and FIG. 8. While the first embodiment makes a plurality of holes in the processing chamber cover 12 to provide the second gas inlets 65-2, this embodiment places below the processing chamber cover 12 a plate called a "showerhead plate" in which a plurality of holes are formed, and forms second gas inlets 65-2 using the holes in the showerhead plate 19 as shown in FIG. 7. Furthermore, the same piping system as that explained in the first embodiment will be used to introduce processing gases into a processing chamber 13.

A processing gas 21-1 which has passed through a merging section 63-1 is introduced into the processing chamber 13 through a first gas inlet 65-1 formed of a pipe penetrating the processing chamber cover 12 and showerhead plate 19. On the other hand, a processing gas 21-2 which has passed through a merging section 63-2 is introduced between the processing chamber cover 12 and showerhead plate 19 through a gas introduction pipe 22 and then introduced into the processing chamber 13 through second inlets 65-2 formed on the showerhead plate. Furthermore, the processing gas 21-1 introduced through the first inlet 65-1 and the processing gas 21-2 introduced through the gas introduction pipe 22 are prevented from mixing with each other in the space between the processing chamber cover 12 and the showerhead plate 19. Furthermore, an O-ring 15' placed beneath the showerhead plate 19 maintains airtightness.

Figure 8:
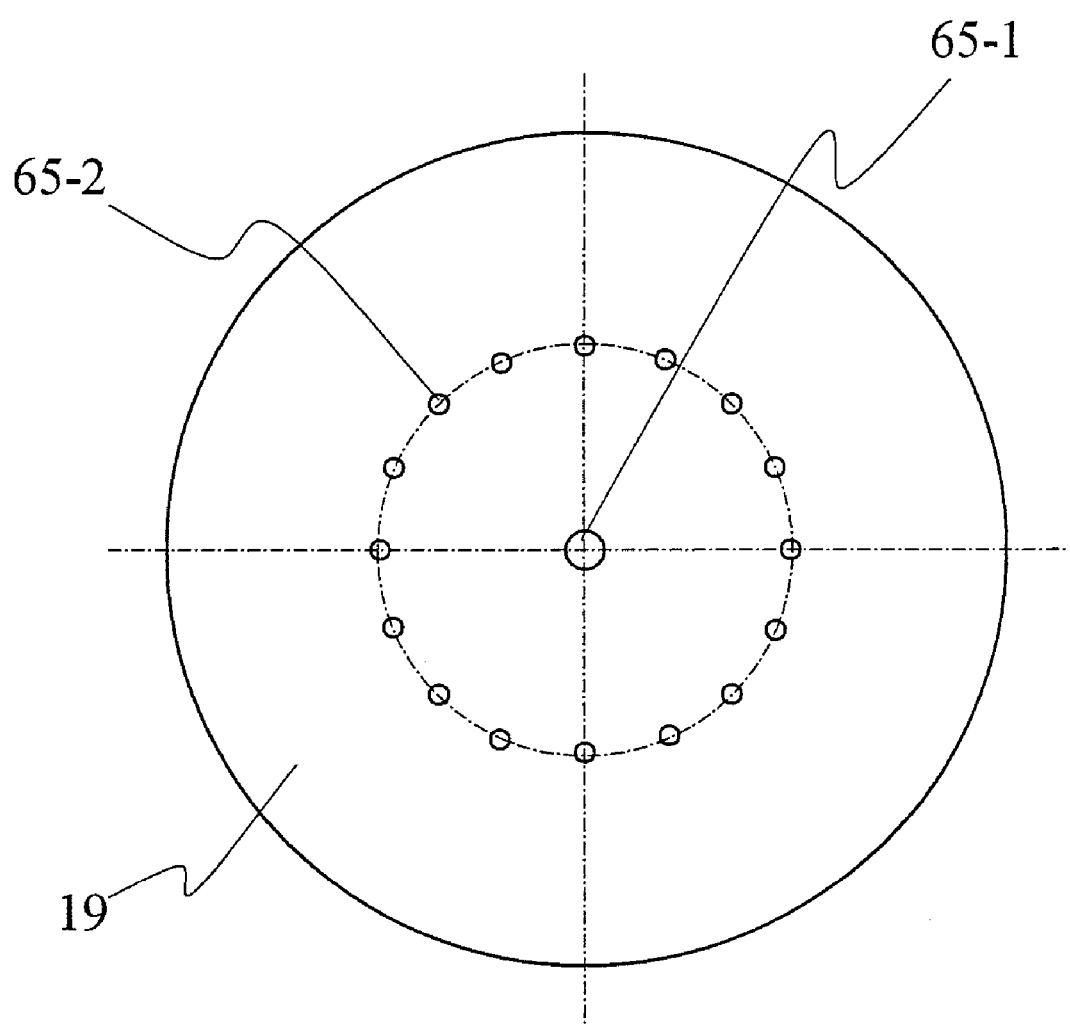
FIG. 8 is a top view of a showerhead plate used for the second embodiment of the present invention.

FIG. 8 shows a top view of the showerhead plate 19. A hole for passing through the pipe forming the first inlet 65-1 is formed in the center of the showerhead plate 19, and the second gas inlets 65-2 are formed in a circular form around the first inlet 65-1.

The conductance between the processing chamber cover 12 and the showerhead plate 19 is designed to be sufficiently larger than the conductance of each of the second gas inlets 65-2, and the processing gas 21-2 introduced through the gas introduction pipe 22 is introduced into the processing chamber 13 from the respective second gas inlets 65-2 at the same flow rate.

Figure 3:
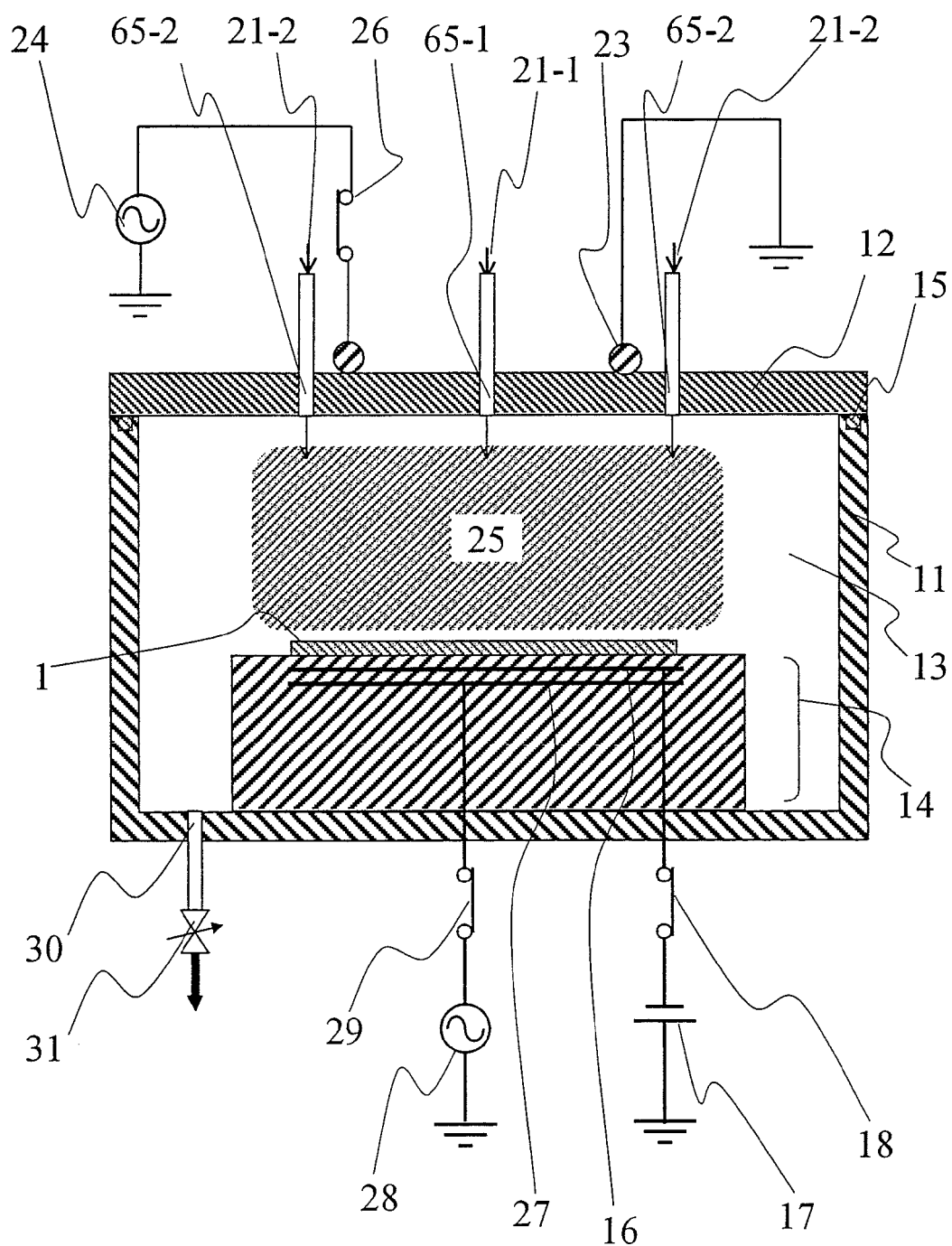
FIG. 3 is a sectional side view of a processing chamber used for the first embodiment of the present invention.

This embodiment makes it possible to form the second gas inlets 65-2 with a simpler structure than that of the first embodiment shown in FIG. 2 and FIG. 3. Moreover, using the structure explained in the first embodiment allows effects similar to those of the first embodiment to be achieved.

Third Embodiment

Figure 9:
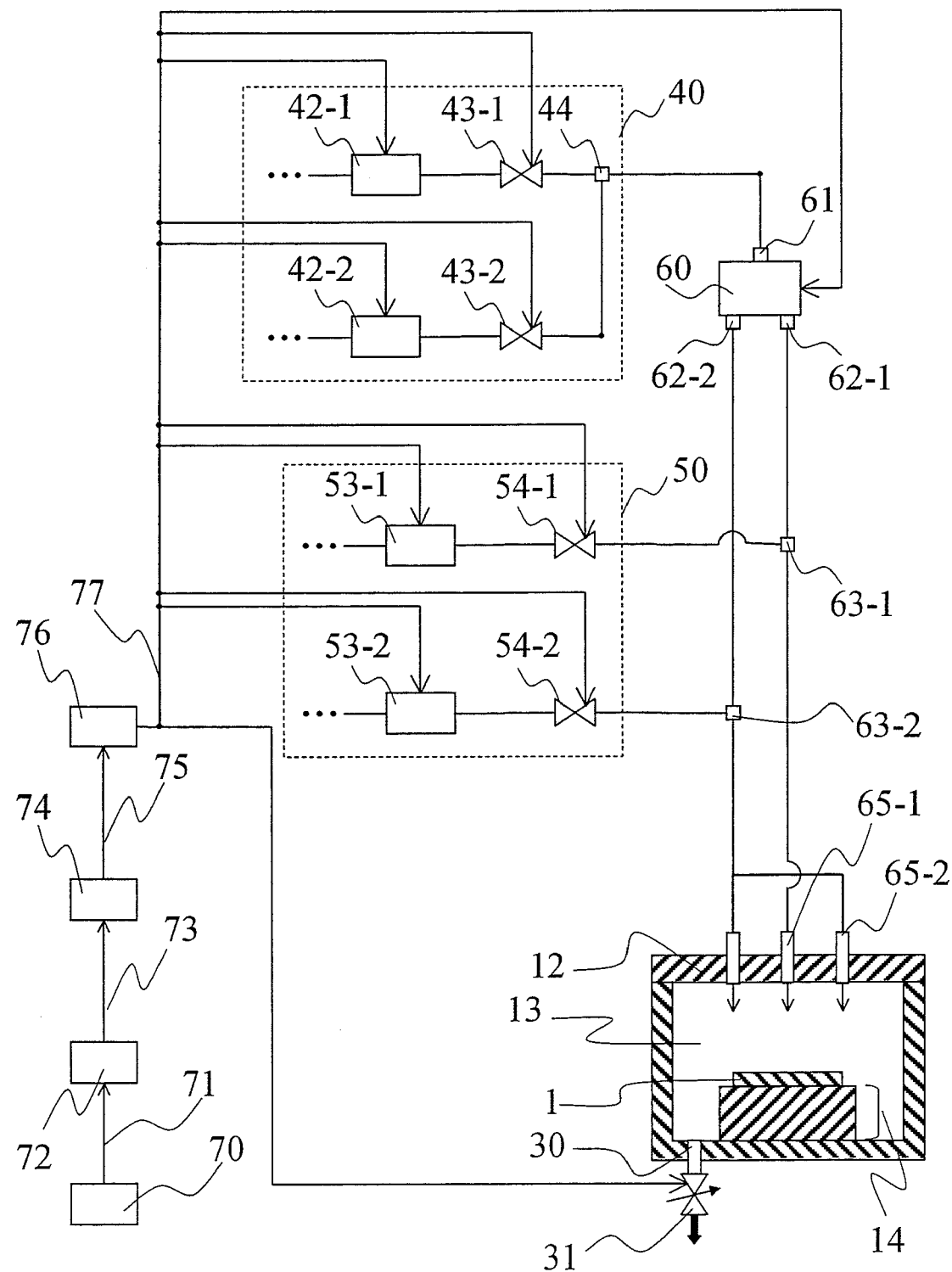
FIG. 9 illustrates a gas piping system and control system according to a third embodiment of the present invention.

Then, a third embodiment of the present invention will be explained with reference to FIG. 9. This embodiment adds a measuring instrument 70, a database 72, an analysis section 74 and a control section 76 to the structure explained in the first embodiment that allows processing gases with different flow rates and compositions to be introduced through a plurality of gas inlets 65.

The measuring instrument 70 is intended to measure an object to be processed 1 before etching or after etching, and a length measuring SEM (Scanning Electron Microscope) and measuring instrument called a "CD-SEM" are examples of this measuring instrument. This irradiates the surface of the object to be processed 1 with electron beams and acquires information on projections and depressions on the surface of the object to be processed 1 using secondary electrons emitted from the irradiated locations, which allows to measure a photoresist mask width 7 before etching and gate width 8 after etching. Moreover, in addition to this, a so-called "OCD (Optical-CD) measuring instrument" can also be used which irradiates the surface of the object to be processed 1 with light rays and acquires information on projections and depressions on the surface of the object to be processed 1 using the reflected light. In addition, a so-called "AFM (Atomic Force Microscope)" can also be used as the measuring instrument 70, which scans the surface of the object to be processed 1 using a lever provided with a small probe called a "cantilever" at one end and acquires information on projections and depressions on the surface of the object to be processed 1. This OCD measuring instrument or AFM also allows measurement of the photoresist mask width 7 before etching and gate width 8 after etching.

Measured data 71 obtained by this measuring instrument 70 at a plurality of positions of the object to be processed 1 is sent to and stored in the database 72.

Data 73 stored in the database 72 is sent to the analysis section 74. The analysis section 74 carries out an analysis based on the data 73, and a control command 75 is sent to the control section 76. Based on the control command 75, the control section 76 sends a control signal 77 to flow rate regulators 42-1, 42-2, 53-1, 53-2 and valves 43-1, 43-2, 54-1, 54-2 and gas shunts 60 and pressure regulating valve 31. These devices perform control based on the received control signal 77.

As described above, by adding the measuring instrument 70, database 72, analysis section 74 and control section 76 to the first embodiment, this embodiment can cope with differences in the photoresist mask width 7 between the center portion and the outer regions of the object to be processed 1. It can further cope with variations in the etching result which varies from one etching process to another. Hereinafter, an example of the processing method using this structure will be explained more specifically.

First, a case where the photoresist mask width 7 of the object to be processed 1 is measured before etching will be explained. The photoresist mask width 7 on the surface of the object to be processed 1 is measured using the measuring instrument 70 such as CD-SEM, OCD measuring instrument or AFM first, and then the measured data 71 is sent to the database 72. This measured data 71 includes data indicating measured locations in the object to be processed 1 and data of the photoresist mask width 7 before etching. Furthermore, when a plurality of objects to be processed are processed successively in mass production, the measured data 71 also includes data for identifying each of the plurality of objects to be processed.

When the photoresist mask width 7 is measured at a plurality of locations within the plane of the object to be processed 1 and its in-plane distribution is calculated, it is important to measure the same positions in a plurality of chips formed on the surface of the object to be processed 1. This is because complicated patterns are formed in a chip and the photoresist mask width 7 is not always identical in all patterns in the chip. Moreover, to suppress variations in the performance among chips formed on the object to be processed 1, it is important to suppress variations in the photoresist mask width 7 at the same position in the chip from one chip to another.

Figure 10A:
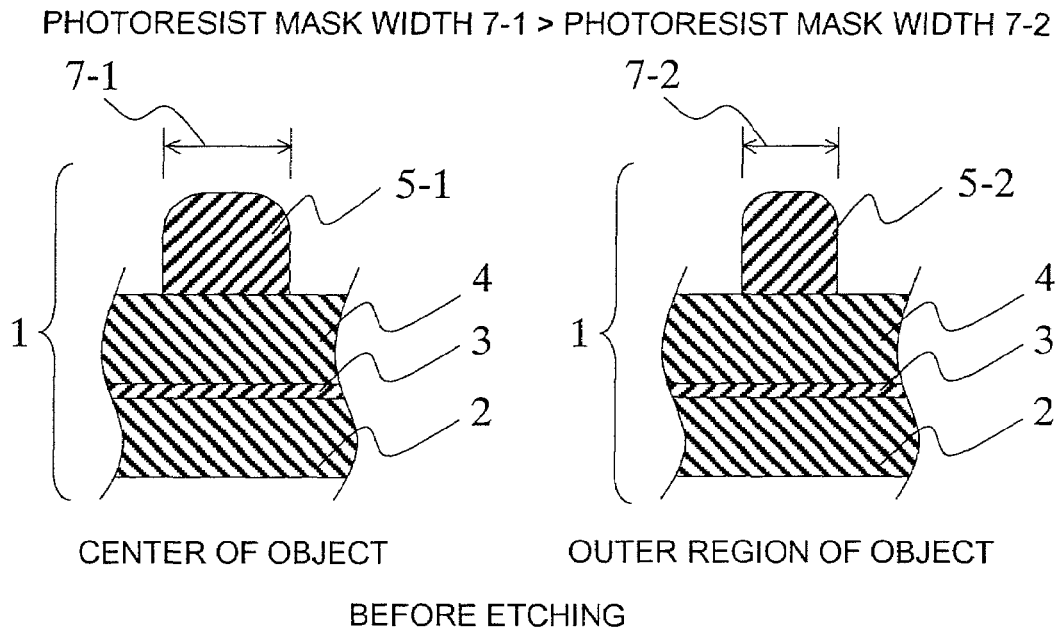
FIG. 10 is a sectional side view of an object to be processed before and after etching of the third embodiment of the present invention.
Figure 10B:
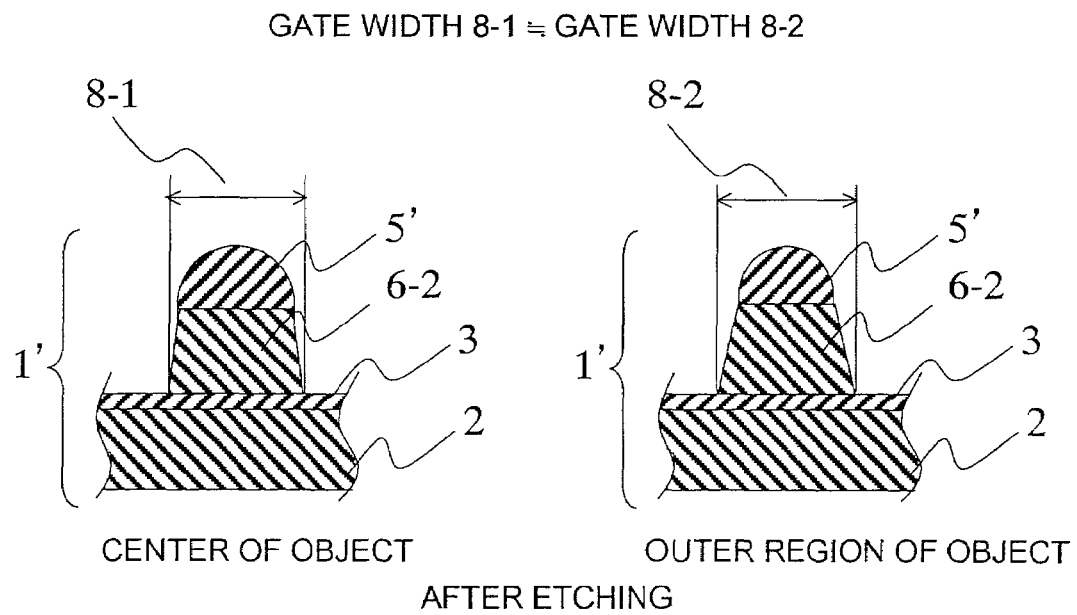

The data 73 stored in the database 72 is sent to the analysis section 74 at appropriate timings. The analysis section 74 analyzes the in-plane distribution of the photoresist mask width 7 on the surface of the object to be processed 1 based on the data 73. For example, as shown in FIG. 10, when the photoresist mask width 7-1 of a chip in the center portion of the object to be processed 1 is large, while the photoresist mask width 7-2 of a chip in the outer region is small, it is possible to regulate the gas condition so that the CD shift becomes greater in the center than in the outer regions, and thereby approximate the gate width 8-1 of the chip in the center portion to the gate width 8-2 in the chip in the outer regions. In this case, it is possible to introduce a processing gas with higher oxygen concentration from the second gas inlets 65-2 placed in the outer regions than from the first gas inlet 65-1 placed in the center of the processing chamber cover 12. The analysis section 74 calculates the necessary flow rate ratios, flow rates and processing pressures of the respective processing gases introduced through the first and second gas inlets 65 to realize this condition. That is, the set flow rate values of the flow rate regulators 42-1, 42-2, 53-1 and 53-2, the set shunt ratio values of the gas shunt 60 and set value of the opening of the pressure regulating valve 31 to realize the set processing pressure are calculated.

The above described analysis is performed by the analysis section 74, the control command 75 reflecting the analysis result is sent to the control section 76 and the control signal 77 is sent from the control section 76 to the devices of the gas piping system. That is, the control signal 77 including the set flow rate value is sent to the respective flow rate regulators 42-1, 42-2, 53-1 and 53-2, valve ON/OFF control signal 77 is sent to the respective valves 43-1, 43-2, 54-1 and 54-2, the control signal 77 including the set shunt ratio value is sent to the gas shunt 60 and the control signal 77 including the set value of the opening to realize the set processing pressure is sent to the pressure regulating valve 31.

As shown above, based on the measurement result of the photoresist mask width 7 obtained by the measuring instrument 70, it is possible to approximate the gate width 8-1 of the chip in the center of the object to be processed 1 to the gate width 8-2 of the chip in the outer regions.

Next, a case where the gate width 8 of the object to be processed 1 is measured after etching will be explained. First, the gate width 8 is measured at a plurality of locations on the surface of the object to be processed 1 using measuring instrument 70 such as a CD-SEM, OCD measuring instrument or AFM, and the measured data 71 is sent to the database 72. This measured data 71 includes data indicating the measurement locations in the object to be processed 1, and data of the gate width 8 after etching. Furthermore, when a plurality of objects to be processed is processed continuously in mass production, the measured data 71 also includes data for identifying data of each of the plurality of objects to be processed. As with the measurement of the photoresist mask width 7, the gate width 8 is measured at the same locations in a plurality of chips formed on the surface of the object to be processed 1, and an in-plane distribution of the object to be processed 1 of the gate width 8 is calculated.

The data 73 stored in the database 72 is sent to the analysis section 74 at appropriate timings. The analysis section 74 analyzes the in-plane distribution of the gate width 8 on the surface of the object to be processed 1 based on the data 73. For example, when the gate width 8-1 of the chip in the center portion of the object to be processed 1 is larger than the target completion size and the gate width 8-2 of the chip in the outer regions is smaller than the target completion size, by regulating the gas condition so that the gate width 8-1 becomes smaller in the chip in the center portion and the gate width 8-2 becomes larger in the chip in the outer regions, it is possible to approximate the gate width 8-1 of the chip in the center portion and the gate width 8-2 of the chip in the outer regions to the target completion size of the gate width 8. In this case, it is possible to reduce the oxygen concentration of the processing gas 21-1 introduced through the first gas inlet 65-1 placed in the center of the processing chamber cover 12 and increase the oxygen concentration of the processing gas 21-2 introduced through the second gas inlet 65-2 placed in the outer regions. The flow rate ratios, flow rates and processing pressures of the processing gases introduced through the first and second gas inlets 65 necessary to realize this condition are calculated by the analysis section 74. That is, the set flow rate values of the flow rate regulators 42-1, 42-2, 53-1 and 53-2, the shunt ratio set value of the gas shunt 60 and the set value of the opening of the pressure regulating valve 31 to realize the set processing pressure are calculated.

The above described analysis is performed by the analysis section 74, the control command 75 reflecting the analysis result is sent to the control section 76 and the control signal 77 is sent from the control section 76 to the devices of the gas piping system. That is, the control signal 77 including the set flow rate value is sent to the respective flow rate regulators 42-1, 42-2, 53-1 and 53-2, valve ON/OFF control signal 77 is sent to the respective valves 43-1, 43-2, 54-1 and 54-2, the control signal 77 including the shunt ratio set value is sent to the gas shunt 60, and the control signal 77 including the set value of the opening to realize the set processing pressure is sent to the pressure regulating valve 31.

As shown above, through feedback control of the etching processing condition based on the measurement result of the gate width 8 obtained by the measuring instrument 70, it is possible to approximate the gate width 8-1 of the chip in the center portion of the object to be processed 1 and the gate width 8-2 of the chip in the outer regions to the target completion size.

The target of the feedback control applied to the etching processing condition based on the measurement result of the gate width 8 may also be a processing of another object to be processed carried out immediately after the measurement of the object to be processed or may be processing of the object to be processed carried out after a processing of two or more objects. Furthermore, a group of objects to be processed are handled in a unit called a "lot" in mass production, and the aforementioned feedback control target may also be a processing carried out one lot or more after the processing of the measured object to be processed. Since measurement using the measuring instrument 70 may take a long time, it is also possible to carry out feedback control on the processing carried out 1 lot or more after the processing of the measured object to be processed based on the measurement result. Furthermore, when processing for manufacturing multiple types of electronic devices is carried out using the same plasma etching apparatus, processing conditions which vary from one type of product to another are often used. For this reason, the target of feedback control is preferably the processing of electronic devices of the same type.

This embodiment uses the processing chamber 13 having the gas inlets 65 formed in the processing chamber cover 12 as shown in the first embodiment, but the present invention is not limited to this embodiment. It is also possible to use the processing chamber 13 using the showerhead plate 19 as shown in the second embodiment.

Fourth Embodiment

Figure 11:
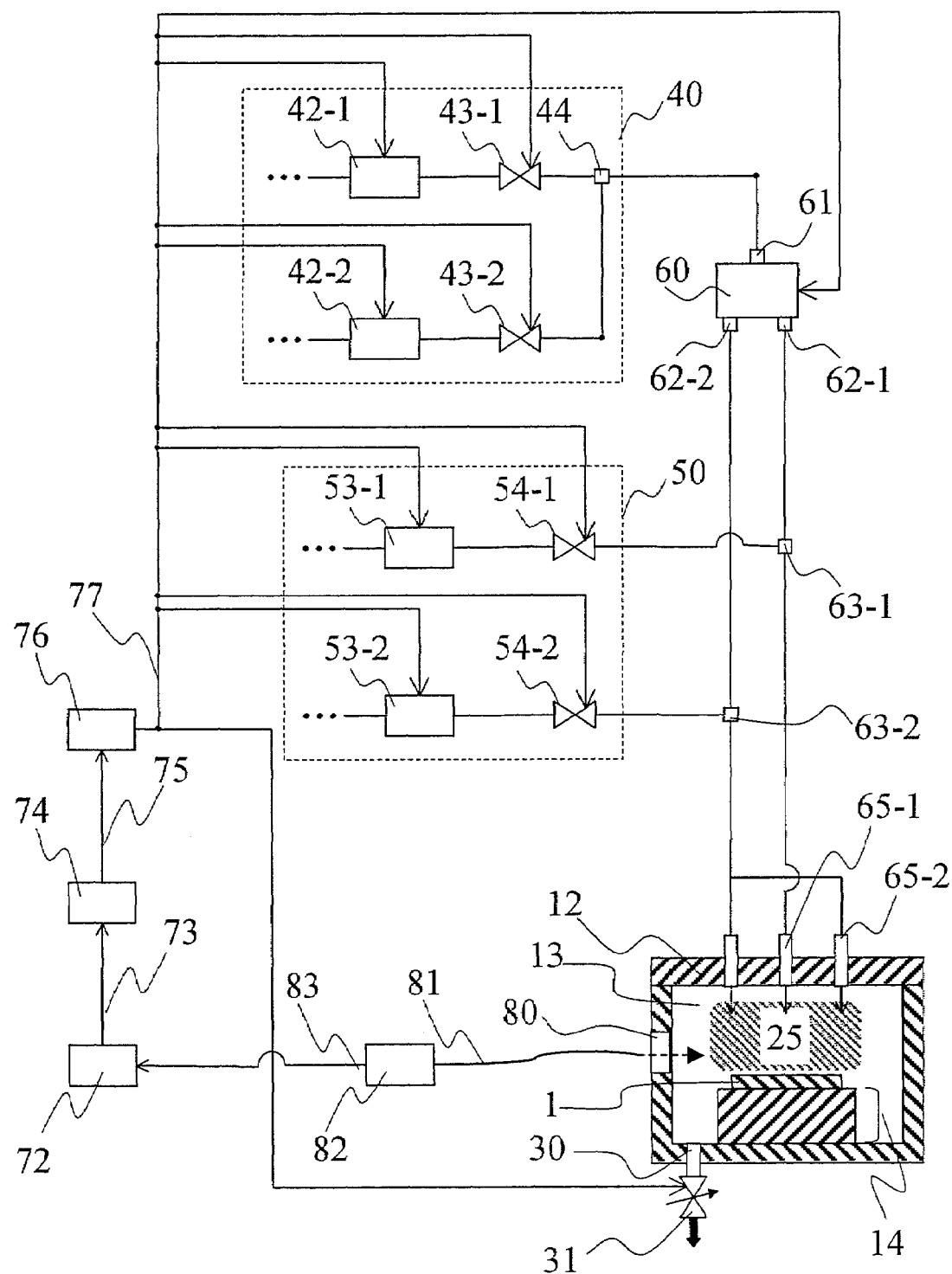
FIG. 11 illustrates a gas piping system and control system according to a fourth embodiment of the present invention.

The fourth embodiment of the present invention will now be explained with reference to FIG. 11. This embodiment adds a photoreception window 80, an optical fiber 81, a spectroscopic section 82, a database 72, an analysis section 74 and a control section 76 to the structure explained in the first embodiment that allows processing gases with different flow rates and compositions to be introduced through a plurality of gas inlets 65.

The photoreception window 80 is provided in a processing chamber wall 11 to allow emission of plasma 25 to be received, and the plasma emission received by the photoreception window 80 is guided to the spectroscopic section 82 through the optical fiber 81. The plasma light is dispersed into a spectrum at the spectroscopic section 82, further converted to multi-channel signals (e.g., signals of 1024 channels in a wavelength range of 200 nm to 800 nm in this embodiment) at certain sampling intervals (e.g., 1 second) periodically every certain wavelength by a CCD (charge-coupled device) incorporated in the spectroscopic section 82. Plasma emission data 83 consisting of multi-channel signals is sent to the database 72. Data 73 stored in the database 72 is sent to the analysis section 74 at appropriate timings, and the analysis section 74 analyzes the plasma 25 from the data 73.

When etching process is performed as described above, reaction products are deposited on the inner surfaces of the processing chamber side wall 11 and processing chamber cover 12. This deposition is also deposited on the inner side of the photoreception window 80, which causes a reduction in the amount of photoreception of the plasma 25 by the optical fiber 81. If the composition and film quality of the deposition on the inner side of the photoreception window 80 are the same, the reduction in the amount of photoreception increases as the thickness of the deposition increases. Furthermore, the reduction in the amount of photoreception at each wavelength varies depending on the wavelength. On the other hand, as shown above, the reaction products deposited on the inner sides of the processing chamber side wall 11 and processing chamber cover 12 are dissociated by the plasma 25, producing ions of silicon and bromine, etc., which may affect the etching of the object to be processed 1 and provoke a variation of the gate width 8. Thus, there is a correlation between the amount of photoreception of the plasma 25 at each wavelength and variation in the gate width 8.

This embodiment calculates in advance a polynomial showing a relationship between the data 73 indicating plasma emission and the gate width 8, and carries out an analysis through the analysis section 74 using this polynomial. Assuming that the gate width 8 at the chip in the center portion of the object to be processed 1 is Gc and the i-th channel signal of the multi-channel signals obtained through the spectroscopic section 82 is Ii, Gc and signal I of each channel are expressed by the following Formula (1) where $f_1$ indicates that Gc is a function of I.

[Formula 1]

$$Gc = f_1(I_1, I_2, \ldots, I_{1024}) \tag{1}$$

Likewise, assuming that the gate width 8 at the chip in the outer regions of the object to be processed 1 is Go and the i-th channel signal of the multi-channel signals obtained through the spectroscopic section 82 is Ii, Go and signal I of each channel are expressed by the following Formula (2) where $f_2$ indicates that Go is a function of I.

[Formula 2]

$$Go = f_1(I_1, I_2, \ldots, I_{1024}) \tag{2}$$

According to these polynomials, the gate width 8 of the chips in the center portion and outer region of the object to be processed 1 is calculated and its in-plane distribution is analyzed. For example, if the analysis result shows that the gate width 8 at the chip in the central part of the object to be processed 1 is larger than a target completion size and the gate width 8 at the chip in the outer region is smaller than the target completion size, by regulating the gas condition so that the gate width 8 at the chip in the center portion becomes smaller and the gate width 8 at the chip in the outer region becomes greater, it is possible to approximate the gate widths 8 at the chips in the center portion and in the outer region to the target completion size. In this case, it is possible to reduce the oxygen concentration of the processing gas 21-1 introduced from the first gas inlet 65-1 placed in the center of the processing chamber cover 12 and increase the oxygen concentration of the processing gas 21-2 introduced from the second gas inlet 65-2 placed in the outer region. It is possible to improve the in-plane distribution of the gate width 8 of the object to be processed 1 and approximate it to the target completion size using these analysis results and by carrying out control similar to that in the third embodiment.

As shown above, by controlling the etching processing condition in real time based on the light emission measurement result of the plasma 25 obtained by the spectroscopic section 82, it is possible to approximate the gate width 8-1 in the center portion and the gate width 8-2 in the outer regions of the object to be processed 1 to their respective target completion sizes.

Here, multi-channel signals obtained by the spectroscopic section 82 are used as variables making up the $f_1$ or $f_2$ function used to calculate the gate width 8, but the number of channels is not particularly limited. This embodiment uses signals I of all 1024 channels, but it is also possible to use signals I of several channels or one channel out of the multi-channel signals obtained.

Fifth Embodiment

Figure 12:
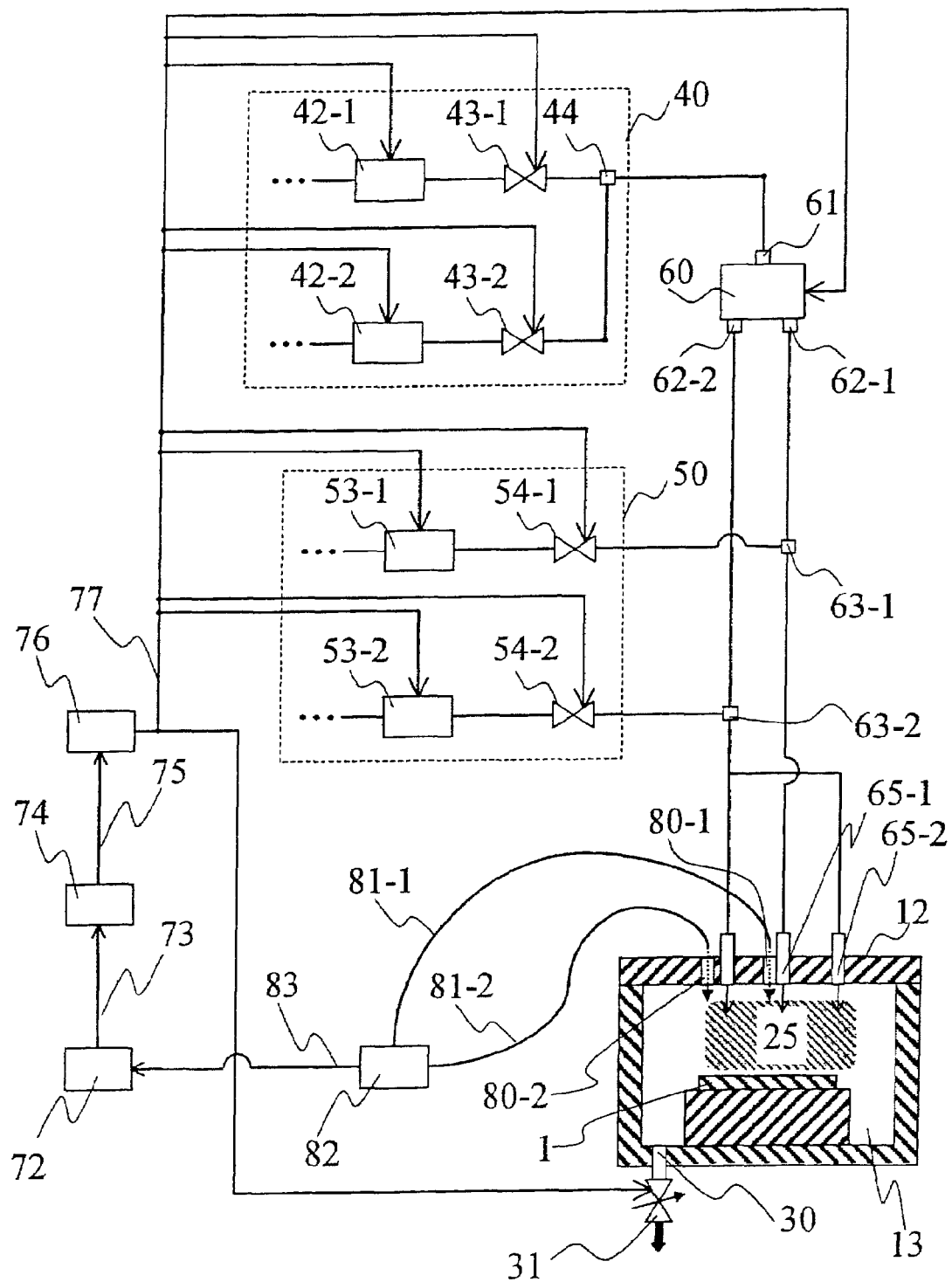
FIG. 12 illustrates a gas piping system and control system according to a fifth embodiment of the present invention.
Figure 13A:
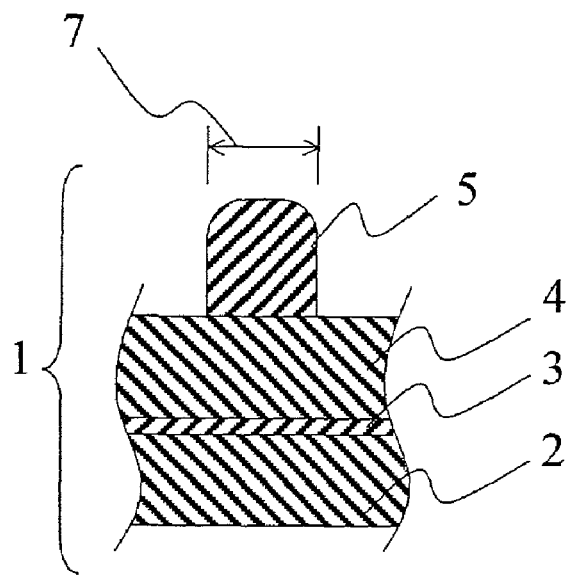
FIG. 13 is a sectional side view of an object to be processed before and after gate etching processing.
Figure 13B:
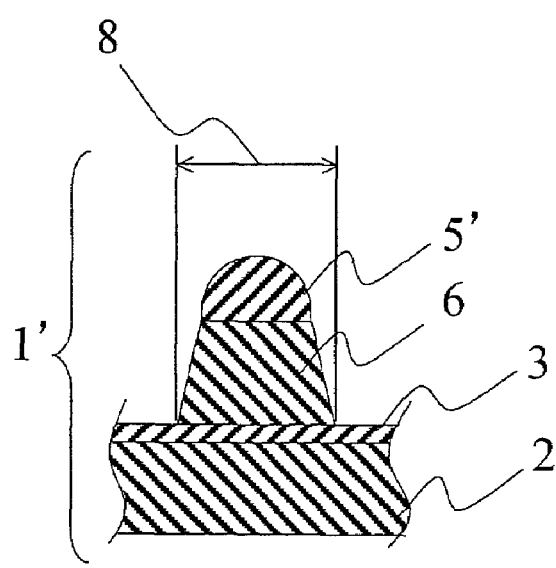
Figure 14:
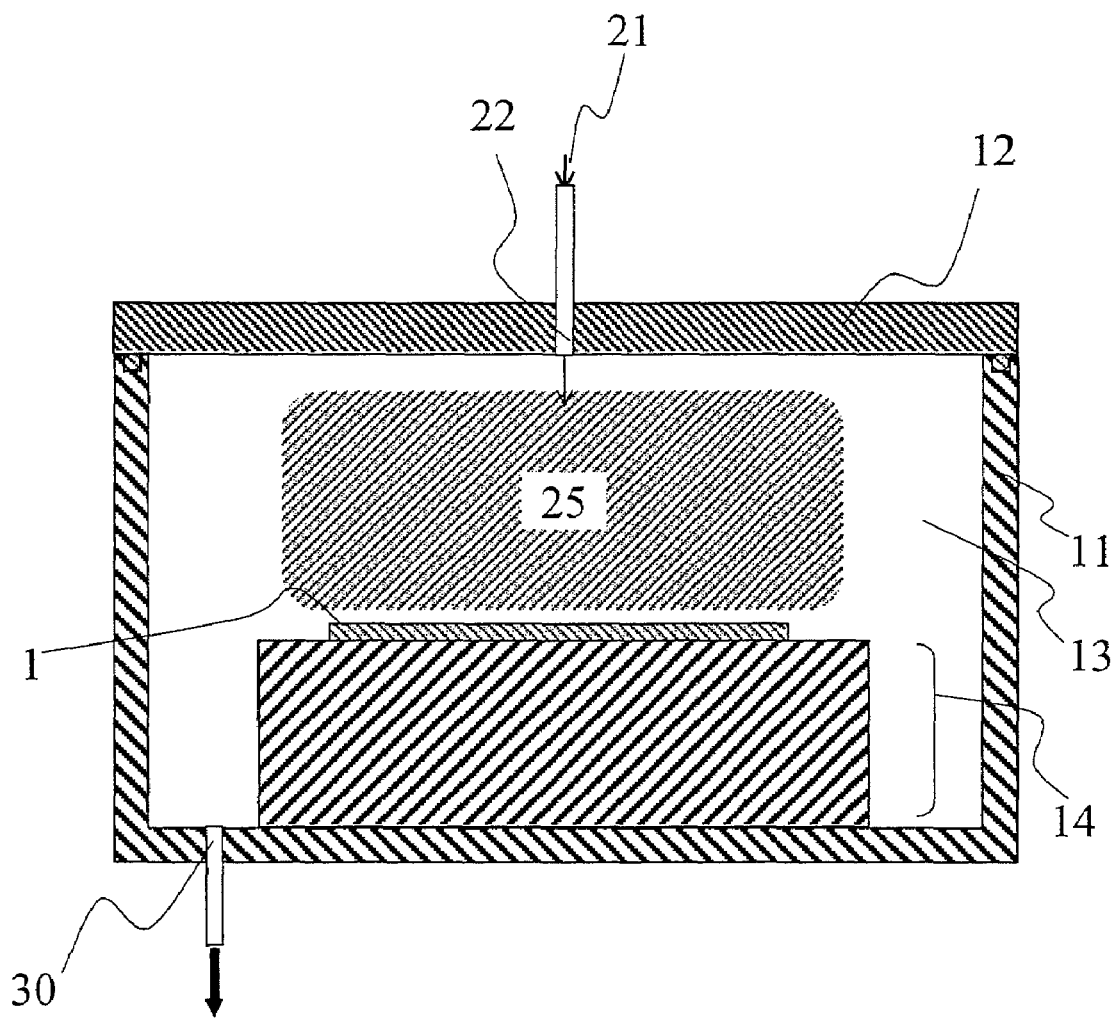
FIG. 14 is a sectional side view of a processing chamber showing a conventional example of a plasma etching apparatus.

A fifth embodiment of the present invention will be explained using FIG. 12. This embodiment adds one additional set of photoreception window 80 and optical fiber 81 to the configuration explained in the fourth embodiment. It also provides two photoreception windows 80 in the center portion and outer regions of the processing chamber cover 12, analyzes concentrations of radicals and ions in the center portion and outer regions in the processing chamber 13 to regulate flow rates and compositions of processing gases 21 introduced from a plurality of locations. A specific method of implementing this embodiment will be explained below.

To allow reception of emission of plasma 25, a first photoreception window 80-1 is provided in the center portion of the processing chamber cover 12 and a second photoreception window 80-2 is provided in the outer regions. Emissions of the plasma 25 received by the respective photoreception windows 80 are guided to a spectroscopic section 82 through an optical fiber 81-1 and an optical fiber 81-2. The respective plasma emissions are dispersed into a spectrum at the spectroscopic section 82, further converted to multi-channel signals (e.g., signals of 1024 channels in a wavelength range of 200 nm to 800 nm in this embodiment) at certain sampling intervals (e.g., 1 second) periodically every certain wavelength by a CCD incorporated in the spectroscopic section 82. Plasma emission data 83 consisting of multi-channel signals is sent to a database 72. Data 73 stored in the database 72 is sent to an analysis section 74 at appropriate timings, and the analysis section 74 analyzes the plasma 25 based on the data 73.

Ions and radicals in the plasma 25 emit light having a wavelength specific to each component. For example, 288 nm or the like for Si, 827 nm or the like for Br, 617 nm or the like for O and 503.5 nm or the like for SiBr. Thus, by analyzing the plasma emission data 83 obtained from the first photoreception window 80-1 placed in the center portion and the second photoreception window 80-2 placed in the outer regions of the processing chamber cover 12, it is possible to compare concentrations of ions and radicals in the center portion and outer regions of the object to be processed 1.

Thus, if an analysis result shows that, for example, the SiBr concentration in the center portion is relatively similar to that in the outer regions and the O concentration is lower in the outer regions than in the center portion, it is possible to introduce a processing gas 21-2 with higher oxygen concentration from the second gas inlet 65-2 placed in the outer regions rather than the processing gas 21-1 introduced from the first gas inlet 65-1 placed in the center portion of the processing chamber cover 12. As a result, it is possible to control the concentration distribution of oxygen in the processing chamber 13 uniformly and approximate the gate width 8 at the chip in the center portion of the object to be processed 1 to the gate width 8 at the chip in the outer regions.

The analysis section 74 calculates the flow rate ratios, flow rates and processing pressures of the respective processing gases introduced from the first and second gas inlets 65 necessary to realize this condition. That is, the set flow rate values of the flow rate regulators 42-1, 42-2, 53-1 and 53-2, set shunt ratio value of the gas shunt 60 and set value of the opening of the pressure regulating valve 31 to realize the set processing pressure are calculated.

The above described analysis is performed by the analysis section 74, the control command 75 reflecting the analysis result is sent to the control section 76 and the control signal 77 is sent to the devices of the gas piping system from the control section 76. That is, the control signal 77 including the set flow rate value is sent to the respective flow rate regulators 42-1, 42-2, 53-1 and 53-2, the valve ON/OFF control signal 77 is sent to the respective valves 43-1, 43-2, 54-1 and 54-2, the control signal 77 including the set shunt ratio value is sent to the gas shunt 60 and the control signal 77 including the set value of the opening of the valve to realize the set processing pressure is sent to the pressure regulating valve 31.

As shown above, by controlling the etching processing condition in real time based on emissions of the plasma 25 received through the first photoreception window 80-1 placed in the center portion of the processing chamber cover 12 and the second photoreception window 80-2 placed in the outer regions, it is possible to approximate the gate width 8 at the chip in the center portion of the object to be processed 1 to the gate width 8 of the chip in the outer regions and improve the in-plane uniformity of the gate width 8.

The embodiments of the present invention have been explained using gate etching as an example, but application of the present invention is not limited to gate etching. It goes without saying that the present invention is also applicable to a plasma etching apparatus and plasma etching method targeted at metal such as aluminum (Al), or silicon dioxide ($SiO_2$) and ferroelectric material or the like.

As described above, the present invention provides a plasma etching processing apparatus and plasma etching processing method which perform processing with excellent in-plane uniformity on an object to be processed having a large diameter.

What is claimed is:

1. A plasma etching method for a plasma etching apparatus comprising:

a processing chamber for performing plasma etching on an object to be processed;

a plurality of gas supply sources for supplying processing gases to the processing chamber;

a gas shunt for dividing the processing gas from the gas supply source;

a first gas inlet for introducing a first processing gas flow divided by the gas shunt to the object to be processed via a center portion of a top of the processing chamber;

a second gas inlet provided separately from the first gas inlet and placed on an outer side of the first gas inlet for introducing a second processing gas flow divided by the gas shunt to the object to be processed via an outer region of the top of the processing chamber;

a third processing gas supply means for supplying a third processing gas to at least one of the divided gas pipes of the first processing gas flow and the second processing gas flow;

a plurality of flow rate regulators for regulating flow rates of the processing gases;

a first photoreception section disposed at a top of the processing chamber for receiving plasma emission light from a center portion of the processing chamber;

a second photoreception section disposed at the outer side at the top of the processing chamber and provided separately from the first photoreception section, the second photoreception section receiving plasma emission light from the processing chamber at a different location from the first photoreception section;

a spectroscopic section for discomposing the plasma emission light into a plurality of wavelength components, where the plasma emission light is received at the first and the second photoreception sections and is in the processing chamber;

an analysis section for analyzing each concentrations of a plurality of radicals in the plasma based on the wavelength components discomposed in the spectroscopic section; and a control unit for supplying the third processing gas to at least one of the gas pipes of the first processing gas flow and the second processing gas flow based on an analysis result in the analysis section, and controlling the introduction of processing gases having different compositions from the first gas inlet and the second gas inlet in order to control distribution of depositional reaction products;

the method comprising:

a first photoreception step for receiving light from a center portion of the processing chamber;

a second photoreception step for receiving light from the processing chamber at a different location from the first photoreception section receiving light from the center portion of the processing chamber;

a spectroscopic step for discomposing the plasma emission light into a plurality of wavelength components;

a step for performing analysis based on the data obtained in the spectroscopic step and generating a control instruction for controlling the flow rate of the flow rate regulator, for controlling a flow dividing ratio of the gas shunt, and for controlling the processing gas supply quantity of the third processing gas supply means; and a control step for generating a control signal based on the control instruction;

wherein the third processing gas is supplied to at least one of the gas pipes of the first processing gas flow and the second processing gas flow, and processing gases having different compositions are introduced from the first gas inlet and the second gas inlet in order to control the distribution of depositional reaction products.

2. A plasma etching method for a plasma etching apparatus comprising:

a processing chamber for performing plasma etching on an object to be processed;

a first gas supply source for supplying a processing gas to the processing chamber;

a second gas supply source provided separately from the first gas supply source for supplying processing gas to the processing chamber;

a gas junction where the processing gases from the first and second gas supply sources are merged;

a gas shunt for dividing the merged processing gas from the gas junction;

a first gas inlet for introducing a first processing gas flow divided by the gas shunt to the object to be processed via a center portion of a top of the processing chamber;

a second gas inlet provided separately from the first gas inlet and placed on an outer side of the first gas inlet at the top of the processing chamber for introducing a second processing gas flow divided by the gas shunt to the object to be processed via the top of the processing chamber;

a third gas supply means for supplying a third processing gas to at least one of the divided gas pipes of the first processing gas flow and the second processing gas flow;

a plurality of flow rate regulators for regulating flow rates of the first, second and third processing gases respectively;

a first photoreception section disposed at a top of the processing chamber for receiving plasma emission light from a center portion of the processing chamber;

a second photoreception section disposed at the outer side at the top of the processing chamber and provided separately from the first photoreception section, the second photoreception section receiving plasma emission light from the processing chamber at a different location from the first photoreception section;

a spectroscopic section for discomposing the plasma emission light received at the first and the second photoreception sections and is in the processing chamber into a plurality of wavelength components;

a database for storing a spectroscopic result of the spectroscopic section;

an analysis section for analyzing each concentrations of a plurality of radicals in the plasma based on the wavelength components discomposed in the spectroscopic section and the data stored in the database; and a control unit for generating a control signal based on an analysis result in the analysis section and a control instruction, supplying the third gas to a gas pipe between the gas shunt and at least one of the gas inlets of the first processing gas and the second processing gas based on the control signal, and controlling the introduction of processing gases having different compositions from the first gas inlet and the second gas inlet in order to control distribution of depositional reaction products;

the plasma etching method comprising;

a first photoreception step for receiving light from a center portion of the processing chamber;

a second photoreception step for receiving light from the processing chamber at a different location from the first photoreception section for receiving light from the center portion of the processing chamber;

a spectroscopic step for discomposing the plasma emission light into a plurality of wavelength components;

a step for storing a result obtained in the spectroscopic step;

an analyzing step for analyzing each concentrations of a plurality of radicals in the plasma based on the data stored in the storing step and the data stored in the database in order to generate a control instruction;

a control step for generating a control signal based on the control instruction;

wherein the third processing gas is supplied to at least one of the gas pipes of the first processing gas flow and the second processing gas flow, and processing gases having different compositions are introduced from the first gas inlet and the second gas inlet in order to control the distribution of depositional reaction products.

* * * * *